United States Patent
Papananos

(10) Patent No.: US 7,253,712 B1
(45) Date of Patent: Aug. 7, 2007

(54) INTEGRATED HIGH FREQUENCY BALANCED-TO-UNBALANCED TRANSFORMERS

(75) Inventor: Yannis Papananos, Marousi (GR)

(73) Assignee: Theta Microelectronics, Inc., San Jose, CA (US)

( * ) Notice: Subject to any disclaimer, the term of this patent is extended or adjusted under 35 U.S.C. 154(b) by 0 days.

(21) Appl. No.: 11/208,979

(22) Filed: Aug. 22, 2005

Related U.S. Application Data

(60) Provisional application No. 60/605,511, filed on Aug. 31, 2004.

(51) Int. Cl.
*H01F 5/00* (2006.01)
(52) U.S. Cl. ....................................... 336/200
(58) Field of Classification Search ............... 336/65, 336/83, 200, 232; 257/531; 333/25–26
See application file for complete search history.

(56) References Cited

U.S. PATENT DOCUMENTS

| | | | |
|---|---|---|---|
| 4,816,784 A * | 3/1989 | Rabjohn | 333/24 R |
| 6,097,273 A * | 8/2000 | Frye et al. | 336/200 |
| 6,380,821 B1 * | 4/2002 | Imbornone et al. | 333/25 |
| 6,396,362 B1 * | 5/2002 | Mourant et al. | 333/25 |
| 6,476,704 B2 | 11/2002 | Goff | |
| 6,577,219 B2 | 6/2003 | Visser | |
| 6,608,364 B2 | 8/2003 | Carpentier | |
| 6,707,367 B2 | 3/2004 | Castaneda et al. | |
| 6,882,263 B2 | 4/2005 | Yang et al. | |
| 7,088,214 B2 * | 8/2006 | Castaneda et al. | 336/200 |
| 2002/0113682 A1 | 8/2002 | Gevorgian et al. | |

* cited by examiner

*Primary Examiner*—Tuyen T. Nguyen
(74) *Attorney, Agent, or Firm*—Blakely, Sokoloff, Taylor & Zafman LLP

(57) ABSTRACT

Integrated high frequency balanced-to-unbalanced transformers suitable for operation in high frequencies, such as radio frequencies. Embodiments disclosed give consideration to issues related to the layout of the primary and secondary inductors for the minimization of capacitive effects between layers while using a minimal number of metal layers. Two solutions are provided, one having embodiments with a symmetrical primary inductor in a 4-metal layer implementation and one having embodiments with a non-symmetrical primary inductor in a 3-metal layer implementation.

10 Claims, 5 Drawing Sheets

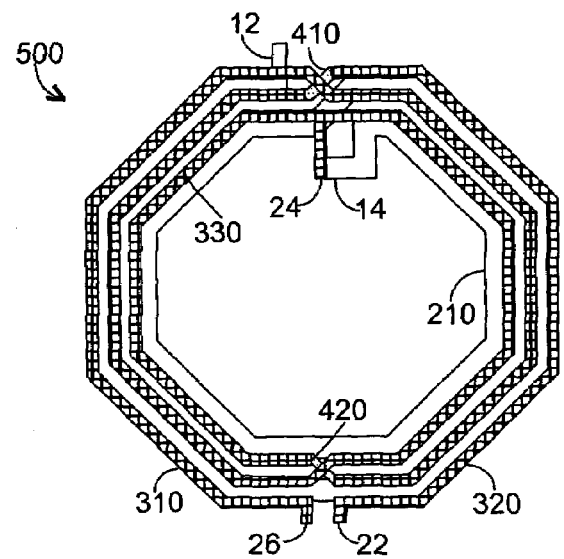
FIGURE 4
FIGURE 5
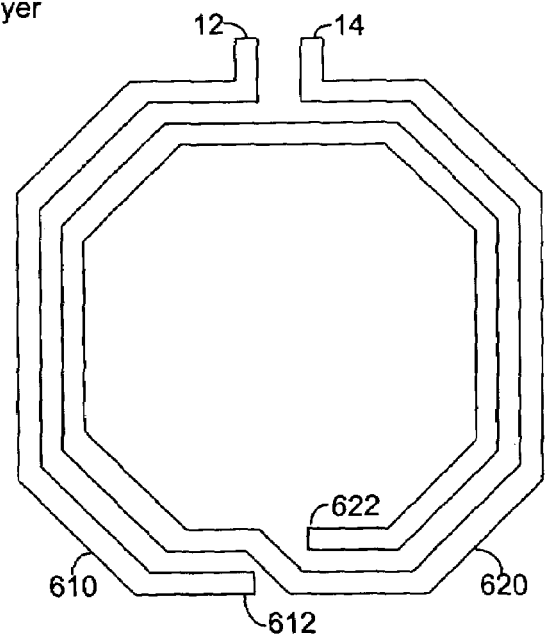
FIGURE 6

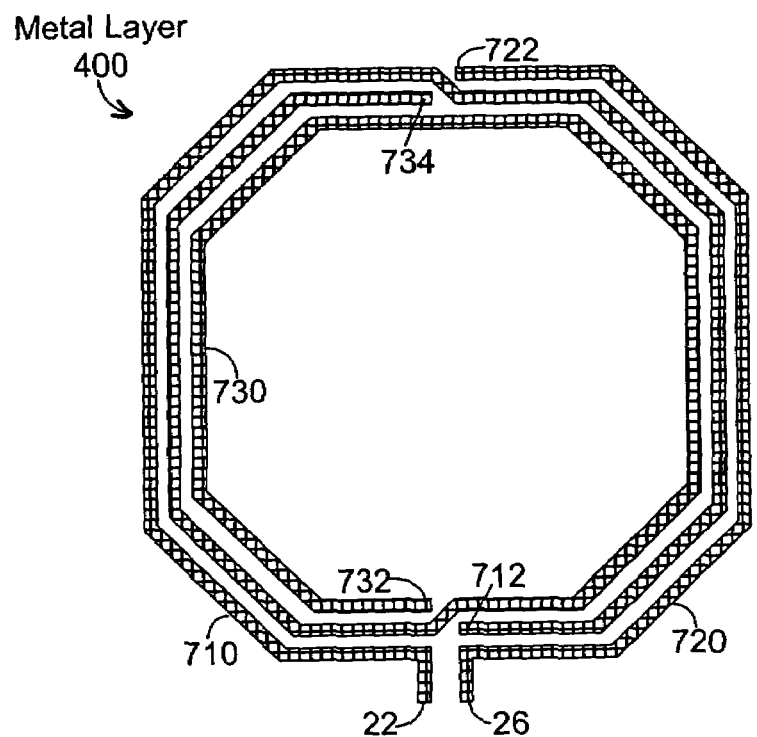
FIGURE 7
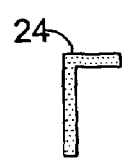
Metal Layer 200
Metal Layer 300
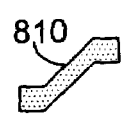
FIGURE 8
FIGURE 9

INTEGRATED HIGH FREQUENCY BALANCED-TO-UNBALANCED TRANSFORMERS

CROSS-REFERENCE TO RELATED APPLICATION

This application claims the benefit of U.S. Provisional Patent Application No. 60/605,511 filed Aug. 31, 2004.

BACKGROUND OF THE INVENTION

1. Field of the Invention

The present invention relates to semiconductor integrated circuits, and more particularly to integrated circuit inductors that are magnetically-coupled for the purpose of creating a high frequency transformer.

2. Prior Art

In wireless communications, an antenna is commonly coupled, typically by means of passive components, to a transformer. In many cases, a balanced-to-unbalanced (BALUN) transformer is used. Such a transformer allows the conversion of a single-ended signal into a differential signal and vice versa. In wireless communications, the antenna receives a single-ended radio frequency (RF) signal. The signal is converted to a differential signal using a BALUN transformer. The operation of BALUN transformers is well-known in the art, and such transformers are usually represented by the schematic 10 shown in FIG. 1A. The unbalanced side of the BALUN transformer has two ends marked 12 and 14 respectively. The balanced side of the BALUN transformer has three connections, two on each end of the inductor marked 22 and 26 respectively, and one at the center of the inductor, marked 24. The balanced side provides for a differential mode. In some cases the inductors of the transformer are wound around a core, directly impacting the mutual inductance between the primary and secondary inductors and therefore the performance of the transformer. Typically node 14 of the primary inductor and node 24 of the secondary inductor are AC grounded, as shown in FIG. 1B.

With the advent of solid state electronics, the ability to integrate components in a single semiconductor device has increased manyfold. This allows the reduction in size, power consumption, and cost, and further provides overall improvement in system performance. It is therefore natural that many attempts have been made to integrate transformers, including BALUN transformers, in order to take advantage of these features. Providing a symmetrical BALUN transformer has been known to be a challenge in the art, as specifically shown in U.S. Pat. No. 6,608,364 by Carpentier (hereinafter "Carpentier") and U.S. Pat. No. 6,707,367 by Castaneda al. (hereinafter "Castaneda"). Carpentier suggests an implementation of a BALUN transformer that has five metallization layers, therefore requiring a complex manufacturing process having many layers often restricting conductor routing over the BALUN transformer. Castaneda suggests an elaborate scheme to provide a symmetrical BALUN transformer, also requiring several layers of metal and dielectric as shown in the various Figs. of Castaneda. Another example may be found in U.S. Pat. No. 6,882,263 by Yang et al. Symmetrical primary and secondary windings of an on-chip BALUN transformer are shown. However, the issue of capacitive coupling between the primary and secondary windings is not addressed, as the windings are essentially positioned such that a maximum capacitive coupling is achieved, having a disadvantage in operation at high frequencies, for example several GHz, as the capacitive coupling will tend to short-circuit the BALUN at these higher frequencies.

As the demand for integrated circuit radios increases, many attempts have been made to integrate transformers and/or transformer BALUNs onto radio frequency integrated circuits. However, such integration has been limited due to flux leakage, capacitive coupling limits, and significant series resistance. To reduce these limitations, advances have been made in transformer IC design including coplanar interleaved transformers, toroidal and concentric transformers, overlay transformers and symmetric coplanar transformers. Coplanar interleaved transformers have the primary and secondary windings interleaved on the same integrated circuit layer, where the primary and secondary windings are constructed of planer metal traces. While coplanar interleaved transformers reduce size and are widely used, they suffer from low quality (Q) factor, small coupling coefficients, and, if used as a BALUN, the center tap is often at an undesirable location, resulting in an asymmetric geometry. As is known, asymmetry of a transformer winding causes an imbalance in the resulting differential signal and/or an imbalance in the resulting single ended signal from a differential signal.

There is therefore a need in the art for a BALUN transformer which is essentially symmetrical, can be implemented in a minimal number of layers of metal, and still provide the electrical characteristics of a BALUN transformer, and especially a reduced capacitive coupling, for the purposes of RF applications, for example in the gigahertz range.

BRIEF DESCRIPTION OF THE DRAWINGS

FIG. 4 is an exemplary layout of the shunts of the first BALUN transformer.

FIG. 5 is a layout of the first BALUN transformer showing the relationship between all three metal layers.

FIG. 6 is an exemplary layout of a pseudo-differential and symmetrical primary inductor of a second embodiment of BALUN transformer.

FIG. 7 is an exemplary layout of a symmetrical secondary inductor of the second BALUN transformer having a displacement in respect to the primary inductor.

FIG. 8 is an exemplary layout of the shunts for the primary inductor of the second BALUN transformer.

FIG. 9 is an exemplary layout of the shunts for the secondary inductor of the second BALUN transformer.

DETAILED DESCRIPTION OF THE PREFERRED EMBODIMENTS

Deficiencies of the prior art have lead to a need to provide BALUN transformers that are more efficient in their design, particularly in the number of metallization layers used for their implementation without significantly adversely affecting the BALUN transformer performance. The solution of the present invention accomplishes this target by having the windings of the primary inductor in one metal layer and the windings of the secondary inductors in another metal layer not only vertically separated from, but also horizontally displaced from the first metal layer. The displacement reduces the capacitive coupling between the primary and secondary coils. Furthermore, the implementations shown enable the use of only three or four layers of metal for a BALUN transformer. It should be noted that the displacement should be such that a substantial magnetic coupling between the primary and secondary inductors of the BALUN is still achieved to ensure the proper performance of the BALUN.

Figure 2:
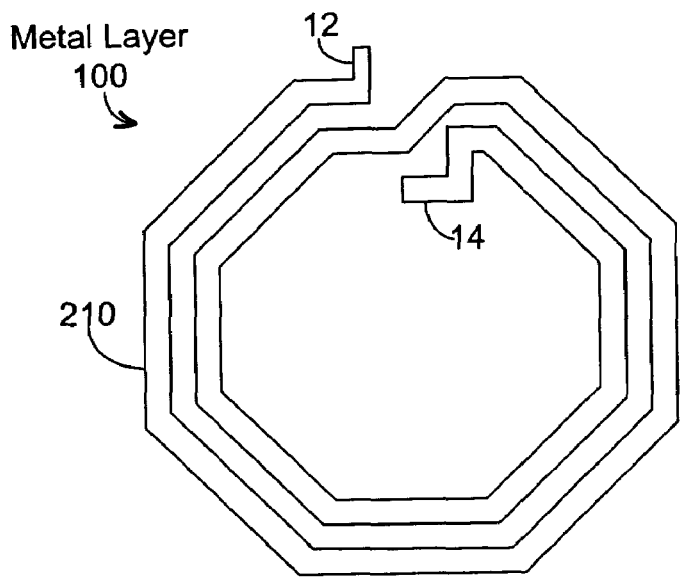
FIG. 2 is an exemplary layout of a primary inductor of a first BALUN transformer using a single metal layer.
Figure 3:
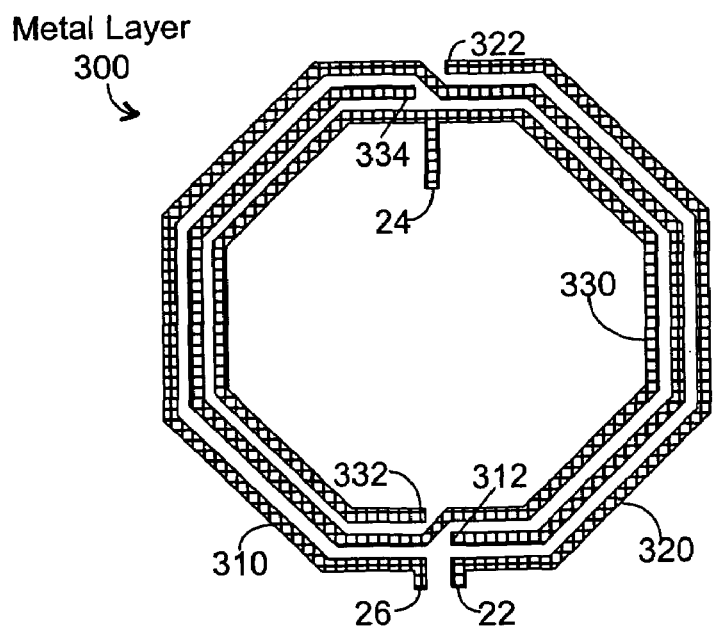
FIG. 3 is an exemplary layout of a symmetrical secondary inductor of the first BALUN transformer having a displacement with respect to the primary inductor.
Figure 10:
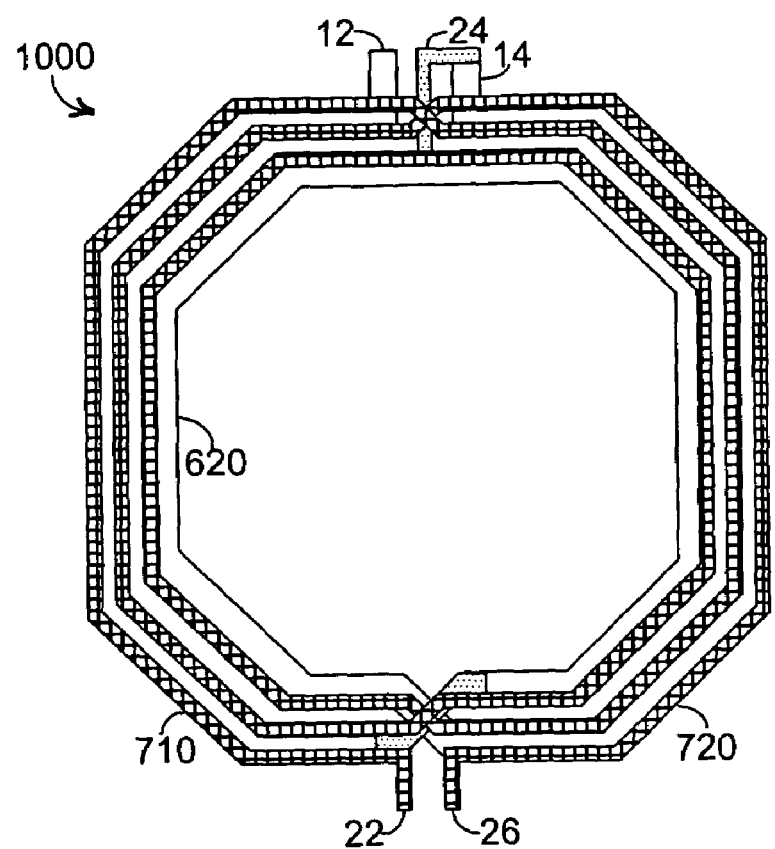
FIG. 10 is a layout of the second BALUN transformer showing the relationship between all four metal layers.

Reference is now made to FIGS. 2 through 4 where each of the three metal layers comprising a BALUN transformer 500, shown in FIG. 10, are implemented in accordance with the disclosed invention are shown. The implementation makes use of three metal layers, metal layer 100, metal layer 200, and metal layer 300. A person skilled-in-the-art will realize that it is not required that the metal layers used are consecutive metal layers, and specific choices may be made for the desired characteristics of the BALUN transformer, such as BALUN transformer 10, including, but not limited to, the grounding of both one of the nodes, for example node 14, of the primary inductor and the center node 24 of the secondary inductor.

In FIG. 2, a primary coil is composed of a continuous winding 210 and ends 12 and 14, implemented on a metal layer 100, and designed to be pseudo-symmetrical, with a slight asymmetry when curving to implement an internal winding. In FIG. 3 a secondary coil, implemented in metal layer 300, is composed of winding segment 310 having ends 312 and 26, winding segment 320 having ends 22 and 322, and winding segment 330 having ends 332 and 334. The complete coil of the secondary coil is achieved by the use of shunt 410, connecting ends 322 and 334 of winding segments 320 and 330 respectively, and shunt 420, connecting ends 312 and 332 of winding segments 310 and 330 respectively. The shunts are shown in FIG. 4.

Winding segments 310, 320 and 330 of the secondary coil of FIG. 3 have a displacement with respect to winding 110 of the primary coil of FIG. 2, as explained in more detail below. The displacement reduces the horizontal overlap between the primary and secondary coils and hence reduces the capacitive coupling between them. Preferably the displacement is such that there is less than fifty percent overlap in the conductive paths between the windings of the secondary and the primary windings, excluding the shunts. A non-overlapping implementation is also possible as long as there is sufficient magnetic coupling between the primary and secondary inductors of the BALUN. In some embodiments of the disclosed invention, the input nodes of the primary inductor are physically one-hundred and eighty degrees from the outputs of the secondary inductor, further achieving symmetry. FIG. 5 shows such an embodiment, with the center tap 24 of the secondary being connected to node 14, typically both being grounded or coupled to a circuit common by a single connection thereto.

Referring now specifically to FIG. 5, a top view of the three metal layers comprising BALUN transformer 10 are shown. In one preferred embodiment, metal layer 100 is the bottom layer, metal layer 200 is the middle layer and metal layer 300 is the upper layer. In particular, the primary coil metal layer 100 would be deposited over an insulator such as silicon dioxide ($SiO_2$), for example on a substrate, typically a silicon substrate, and then patterned using conventional photolithography techniques. Notably, metal layer 100 may be any one of the metal layers available for use in the device. Then another $SiO_2$ layer is deposited, followed by the depositing and patterned of another metal layer 200 to form the shunts. A further $SiO_2$ is deposited and windows opened (etched) therein to expose the ends of the shunts for VIAs, and in the embodiment being described, an opening through the last two $SiO_2$ layers to expose node 14 of the primary inductor. Then a final metal layer is deposited and patterned, making electrical contact with the shunts the form the complete secondary winding, and providing a common connection to one primary node (14) and the center node 24 of the secondary winding. It should be further noted that it is not required that the metal layers, used in the BALUNs of the present invention, be consecutive metal layers. Hence if a semiconductor device has available a total of seven metal layers, then if three metal layers are used for the BALUN, any three of the seven metal layers may be of use.

By using this arrangement, the vertical distance between the primary coil and the secondary coil is further increased and therefore contributes to a reduction in the capacitive coupling between the coils. The primary coil is accessed at nodes 12 and 14 in metal layer 100. Since node 14 is connected to the center node 24 of the secondary inductor, it is further possible to access node 14 in metal layer 200. The secondary coil ends 22 and 26 are accessed in metal layer 300, while center node 24 of the secondary coil is accessed at end 24 in metal layer 300, as well as through node 14 in metal layer 100 as explained above.

In one alternate embodiment, the order of the layers may be reversed, namely layer 300, then layer 200 and finally layer 199. In another embodiment of the disclosed invention, metal layer 300 follows metal layer 100 in the vertical stack, with the last metal layer being metal layer 200. Connection between layers is achieved by the use of VIAs or stacked VIA holes which are well-known in the art. The inventors have noted that this implementation provides for minimal losses and has a narrowband balancing.

Typical external diameter for a BALUN transformer in accordance with the disclosed invention is between 200 and 800 micron. Spacing between turns in the primary coil is typically 5 to 10 microns, and between turns of the secondary coil is typically 5 microns. A conduction path width of the primary inductor is typically between 10 and 20 microns and the secondary inductor path width is typically 5 microns. Therefore, in a preferred embodiment of the invention, with a fifty percent overlap of the secondary with respect to the primary, only 2.5 micron of width, or less, of the secondary inductor will be in overlap with the windings of the primary inductor. The typical numbers provided herein are of course exemplary only, and are not intended to limit the scope of the disclosed invention.

Figure 1A:
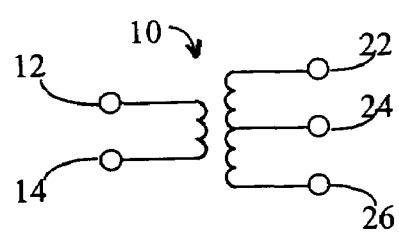
FIG. 1A is a schematic drawing of a BALUN transformer.
Figure 1B:
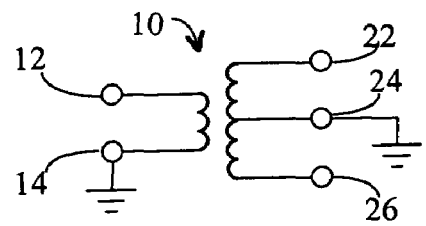
FIG. 1B is a schematic drawing of a BALUN transformer with a grounded node of the primary coil and a grounded center node of secondary coil.

Reference is now made to FIGS. 6 through 9 where each of the four metal layers comprising a BALUN transformer 1000, shown in FIG. 10 in accordance with another embodiment of the present invention are shown. This embodiment is designed to provide broadband balancing. The implementation makes use of four metal layers, metal layer 100, metal layer 200, metal layer 300, and metal layer 400. These layers are shown in FIGS. 6 through 9. A person skilled-in-the-art will realize that it is not required that the metal layers used be consecutive metal layers, and specific choices may be made to accommodate the specific characteristics of BALUN transformer 1000. The schematic of BALUN transformer 1000 is identical to the schematic shown for BALUN transformer 10 in FIG. 1B, and therefore node designation shall again remain the same.

In FIG. 6, a primary coil is composed of a winding segment 610 having ends 12 and 612, and a winding segment 620 having ends 622 and 14. Winding segments 610 and 620 are implemented in a patterned metal layer 100. In FIG. 8, there is shown a shunt 810 implemented in patterned metal layer 200. Shunt 810 connects ends 612 and 622 of windings 610 and 620 respectively. By connecting winding segments 610 and 620, shunt 810 completes an implementation of a primary coil of BALUN transformer 1000, creating a pseudo-differential inductor, having only two spirals. In FIG. 7 a secondary coil is composed of winding segment 710 having ends 22 and 712, winding segment 720 having ends 26 and 722, and winding segment 730 having ends 732 and 734. Segments 710, 720 and 730 of the secondary coil of BALUN transformer 1000 are implemented in patterned metal layer 400. In FIG. 9 there are shown shunts 910 and 920 implemented in patterned metal layer 300. Shunt 910 connects ends 722 and 734 of windings 720 and 730, and shunt 920 connects ends 712 and 732 of windings 710 and 730. By connecting winding segments 710, 720 and 730, shunts 910 and 920 complete an implantation of a differential secondary coil of BALUN transformer 1000, where typically center node 24 is grounded, and connected to one of the nodes of the primary coil, for example node 14. Winding segments 710, 720 and 730 have a displacement with respect to winding segments 610 and 620 of the primary coil, as explained in more detail below. The displacement reduces the overlap between the primary and secondary coils and hence the capacitive coupling between them. Preferably the displacement is such that there is less than fifty percent overlap in conductive path width between the windings of the secondary and the primary windings, excluding the shunts. A non-overlapping implementation is also possible as long as there is sufficient magnetic coupling between the primary and secondary inductors of the BALUN. In one embodiment of the disclosed invention, the output nodes of the primary inductor are physically one-hundred and eighty degrees from the outputs of the secondary inductor, further allowing for achieving symmetry.

Referring now to FIG. 10, the four metal layers comprising BALUN transformer 1000 are shown. In one preferred embodiment, metal layer 100 is the bottom layer, metal layer 200 is a first middle layer followed by metal layer 300, and metal layer 400 is the upper layer. However, a person skilled-in-the-art would easily note that a reverse order could be used, or in fact, any order that would not cause a restriction on the connection between the different metal layers. The primary coil is accessed at ends 12 and 14 in metal layer 100. End 14 may be further accessed via node 24 of the secondary coil, connected through shunt 24 shown in FIG. 8. The secondary coil ends 22 and 26 are accessed in metal layer 400. Center node 24 of the secondary coil is accessed via metal layer 200 which is also connected, for example by use of a VIA to node 14 in metal layer 100. Connection between layers is achieved by the use of VIA or stacked VIA holes which are well-known in the art. The fabrication process in general may be similar to that previously described.

In the BALUNs of the present invention, each layer is separated from adjacent layers by an electrically insulative (dielectric) layer, preferably $SiO_2$, though other substrates and other electrically insulative layers could be used if desired. In that regard, silicon and $SiO_2$ are preferred as being most compatible with integrated circuit fabrication processes. The metal layers may be of various metals, though high electrical conductivity metals are preferred, such as aluminum, gold or silver. It should be further noted that it is not required that the metal layers, used in the BALUNs of the present invention, be consecutive metal layers. Hence if a semiconductor device has available a total of seven metal layers, then if three metal layers are used for the BALUN, any three of the seven metal layers may be of use.

The inventors have noted that the foregoing implementation provides for minimal losses and has a broadband balancing. Typical external diameter for a BALUN transformer in accordance with the disclosed invention is between 200 and 800 micron. Spacing between winds in the primary coil are typically 5 to 10 microns, and between windings of the secondary coil are typically 5 microns. A path width of the primary inductor is typically between 10 and 20 microns and the secondary inductor is typically 5 microns. Therefore, in a preferred embodiment of the invention, with a fifty percent overlap, only 2.5 micron of width, or less, of the secondary inductor conductive path will be in overlap with the windings of the primary inductor. Again, the typical numbers provided herein are exemplary purposes only and are not intended to limit the scope of the disclosed invention.

Figure 11:
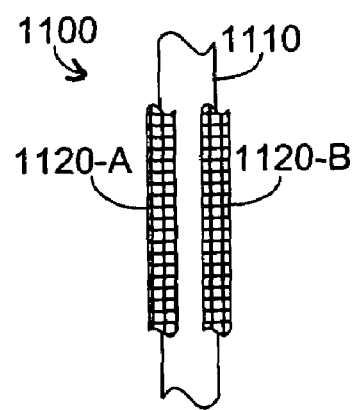
FIG. 11 is a diagram of a portion of primary coil metal layer and the secondary coil metal layer showing the displacement between the respective windings.

Reference is now made to FIG. 11 where a diagram of a first portion 1110 of a primary coil metal layer and a second portion 1120-A and a third portion 1120-B of a secondary coil metal layer are shown. The layout of the second portion and third portion is in displacement with respect to the first portion. By avoiding full coverage between the primary and secondary coils, the parasitic coupling capacity is reduced and overall performance of the BALUN transformer improved. This separation further allows the use of a wider first portion and therefore reduces the resistance of the primary inductor.

Figure 12:
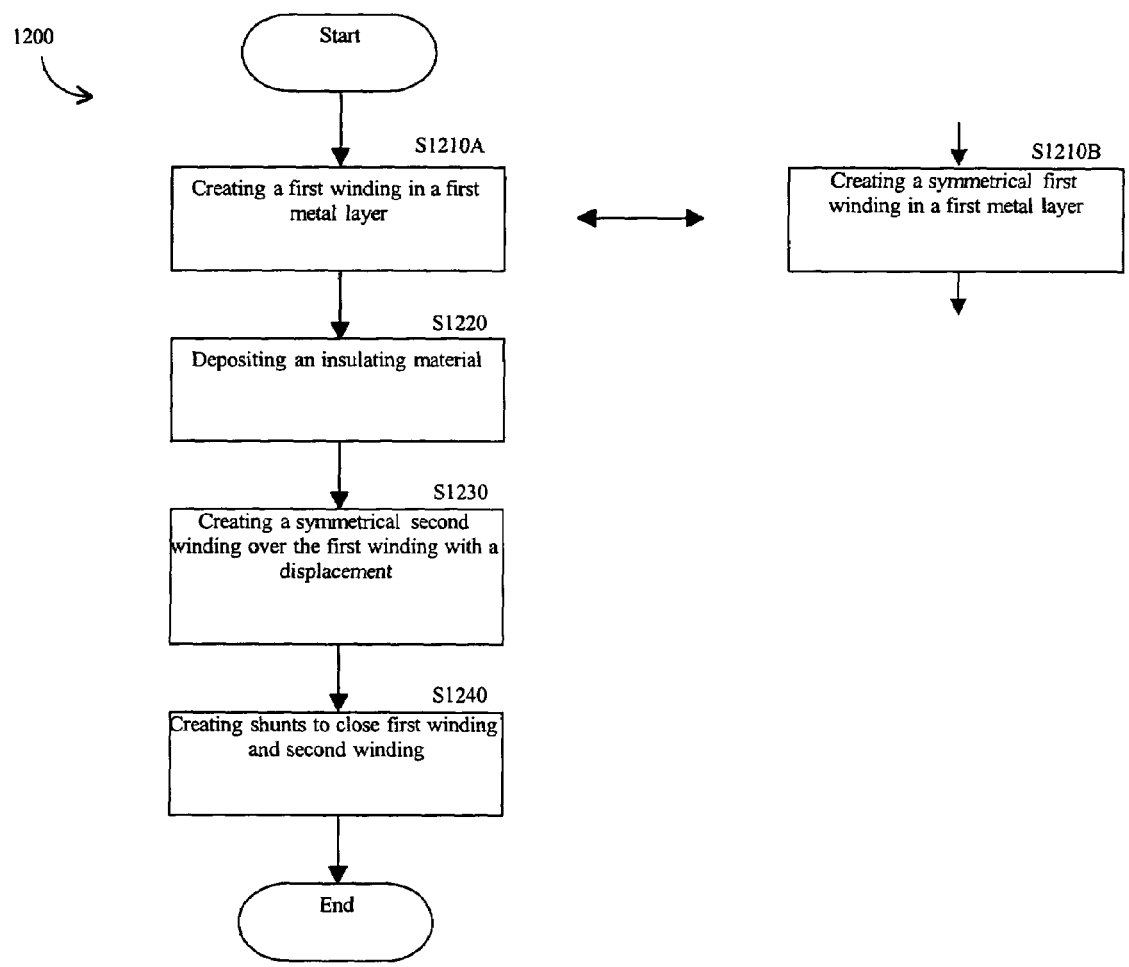
FIG. 12 is a flowchart of the process steps respective of the manufacture of the BALUN transforms in accordance with the disclosed invention.

Reference is now made to FIG. 12 where an exemplary flowchart 1200 of the process of manufacture of the BALUN transformers disclosed herein is shown. In one embodiment of the manufacturing process, in step S1210A there is created in a first metal layer an essentially pseudo-symmetrical winding. Alternatively, step S1210B is used where there is created a first winding that is symmetrical, as explained above with respect to FIG. 6. In step S1220 there is deposited a layer of non-conducting material that is an insulator between one layer of metal and another layer of metal, and has further known dielectric characteristics. Therefore, when depositing another metal plate on top of the dielectric, there will be formed a parasitic capacitor, known also as a coupling capacitance, between the two layers of metal, reducing the performance of the BALUN. In accordance with the disclosed invention, in step S1230 there is created a symmetrical second winding, as may be seen with respect to FIGS. 3 and 7, the second winding being concentric with, but horizontally displaced from the turns of the first winding. In one embodiment, the overlap between the second winding and the first winding is no more than fifty percent of the conductive path width of the second winding, excluding shunts. A non-overlapping implementation is also possible as long as there is sufficient magnetic coupling between the primary and secondary inductors of the BALUN. In some embodiments of the disclosed invention, the output nodes of the primary inductor are physically one-hundred and eighty degrees from the outputs of the secondary inductor, further providing symmetry. In step S1240, shunts are created to ensure continuous conducting paths through each of the first winding and the second winding. A person skilled in the art would readily recognize that the shunts may be created at multiple metal layers and hence the specific order shown herein should not be viewed as a limitation of the invention. Furthermore, it should be noted that the preferred manufacturing processes in general are well-known in the art, and are not provided herein in great detail in order to maintain clarity of the disclosed invention. Also while certain preferred embodiments of the present invention have been disclosed and described herein for purposes of illustration and not for purposes of limitation, it will be understood by those skilled in the art that various changes in form and detail may be made therein without departing from the spirit and scope of the invention. As an example, while in embodiments shown herein with respect of FIGS. 6, 7 and 8, where the primary inductor has two turns and the secondary inductor has three turns, other configurations may be used. For example, and without limitation to the disclosed invention, embodiments of a BALUN having three turns in the primary inductor and five turns in the secondary inductor, or, four turns in the primary inductor and seven turns in the secondary inductor, are also possible.

What is claimed is:

1. An on-chip three-metal layer balanced-to-unbalanced (BALUN) transformer comprising:
   a first winding conductive path formed in a first metal layer defining a multiple turn primary inductor of the BALUN transformer, the first winding conductive path having a first port at one end of the first winding conductive path and a second port at the other end of the first winding conductive path; and,
   a second winding conductive path having a plurality of symmetrical winding segments formed in a second metal layer;
   shunts formed in a third metal layer and electrically connecting the winding segments at respective intersections, thereby forming a secondary inductor of the BALUN transformer, the secondary inductor having a third port and a fourth port and further having a center tap connection from a position essentially at the middle of the secondary inductor as a fifth port;
   the secondary inductor conductive path being displaced vertically and horizontally from the first winding conductive path to reduce capacitive coupling between the primary inductor and the secondary inductor while maintaining a sufficient magnetic coupling between the first winding conductive path and the secondary inductor.

2. The BALUN of claim 1 wherein the primary inductor comprises a plurality of concentric windings, ends of adjacent concentric windings being electrically connected by an integral metal segment in the first metal layer.

3. The BALUN of claim 1 wherein the ports of the first winding conductive path are physically positioned one-hundred and eighty degrees from the ports of the secondary inductor.

4. The BALUN of claim 1 wherein the second winding conductive path has an overlap with the first winding conductive path not exceeding fifty percent of a width of the second winding conductive path.

5. The BALUN of claim 1 wherein the displacement results in no overlap between the first winding conductive path and the second winding conductive path.

6. The BALUN of claim 1 wherein the layers are physically ordered first metal layer, third metal layer and then the second metal layer.

7. The BALUN of claim 6 wherein the order stated is with the first metal layer closest to a substrate on which the BALUN is formed.

8. The BALUN of claim 1 wherein the ports of the first winding conductive path are physically positioned one-hundred and eighty degrees from the third and fourth ports of the secondary inductor, and wherein the center tap of the secondary inductor is in electrical contact with the one of the first and second ports of the primary inductor.

9. An on-chip balanced-to-unbalanced (BALUN) transformer comprising:
   a first winding conductive path formed in a first metal layer defining a multiple turn primary inductor of the BALUN transformer, the first winding conductive path having a first port at one end of the first winding conductive path and a second port at the other end of the first winding conductive path; and,
   a second winding conductive path having a plurality of symmetrical winding segments formed in a second metal layer defining a secondary inductor of the BALUN transformer, the secondary inductor having a third port and a fourth port and further having a center tap connection from a position essentially at the middle of the secondary inductor as a fifth port;
   the secondary inductor conductive path being vertically and horizontally displaced from the first winding conductive path to reduce capacitive coupling between the primary inductor and the secondary inductor while maintaining a sufficient magnetic coupling between the first winding conductive path and the secondary inductor.

10. The BALUN transformer of claim 9, wherein the first winding conductive path is symmetrical.

* * * * *